(12) United States Patent
Takahashi et al.

(10) Patent No.: US 6,720,845 B2
(45) Date of Patent: Apr. 13, 2004

(54) SAW FILTER DEVICE AND PACKAGE FOR ACCOMMODATING THE SAME

(75) Inventors: Yoshihiro Takahashi, Tokyo (JP); Tadaaki Tuda, Tokyo (JP); Yasushi Yamamoto, Tokyo (JP); Hiroshi Kawahara, Tokyo (JP)

(73) Assignee: NRS Technologies Inc., Hakodate (JP)

( * ) Notice: Subject to any disclaimer, the term of this patent is extended or adjusted under 35 U.S.C. 154(b) by 30 days.

(21) Appl. No.: 09/986,096

(22) Filed: Nov. 7, 2001

(65) Prior Publication Data

US 2002/0053958 A1 May 9, 2002

(30) Foreign Application Priority Data

Nov. 9, 2000 (JP) ......................... 2000/342686

(51) Int. Cl.[7] ........................ H03H 9/64; H03H 9/145; H03H 9/25
(52) U.S. Cl. .................................... 333/193; 310/313 B
(58) Field of Search ................. 333/193–196; 310/313 R, 313 B, 313 C, 313 D

(56) References Cited

U.S. PATENT DOCUMENTS

| | | | | |
|---|---|---|---|---|
| 5,202,652 A | * | 4/1993 | Tabuchi et al. | 333/193 |
| 5,548,256 A | * | 8/1996 | Watanabe et al. | 333/194 |
| 5,757,250 A | * | 5/1998 | Ichikawa et al. | 333/193 |
| 5,889,446 A | * | 3/1999 | Yamada et al. | 333/193 |
| 6,034,578 A | * | 3/2000 | Fujita et al. | 333/193 |
| 6,150,904 A | * | 11/2000 | Taniguchi et al. | 333/193 |

FOREIGN PATENT DOCUMENTS

| | | | | |
|---|---|---|---|---|
| JP | 56-149110 | * | 11/1981 | 333/155 |
| JP | 56-149813 | * | 11/1981 | 333/155 |
| JP | 5-55866 | * | 3/1993 | 333/193 |
| JP | 6-132759 | * | 5/1994 | 29/25.35 |
| JP | 9-186550 | * | 7/1997 | |
| JP | 10-126207 | * | 5/1998 | |
| JP | 2000-196408 | * | 7/2000 | |

* cited by examiner

Primary Examiner—Barbara Summons
(74) Attorney, Agent, or Firm—McGinn & Gibb, PLLC

(57) ABSTRACT

A GND terminal 74 extends into a package 7, and the inwardly extending portion has a laterally extending portion (lateral portion) and a longitudinally extending portion (longitudinal portion). The lateral and longitudinal portions of the GND terminal 74 form an L-shaped metal portion 80 extending in a recess 78 of the package 7. When accommodating an SAW filter 100 in the package 7, the SAW package 100 is set in the recess 78 of the package 7 such that the back surface of the chip substrate is in contact with the L-shaped portion 80.

32 Claims, 10 Drawing Sheets

(A)

(B)

(A)

(B)

(A)

(B)

(A)

(B)

(A)

(B)

(A)

(B)

(C)　　　　　　　　　　(A)

(B)

PRIOR ART

SAW FILTER DEVICE AND PACKAGE FOR ACCOMMODATING THE SAME

BACKGROUND OF THE INVENTION

This application claims benefit of Japanese Patent Application No. 2000-342686 filed on Nov. 9, 2000, the contents of which are incorporated by the reference.

The present invention relates to elastic surface wave filter devices used for optical communication systems and mobile radio communication systems and packages for accommodating elastic surface wave filters.

Elastic surface wave (hereinafter referred to as SAW) filters have such features as small size, high stability, high accuracy, high reliability and freedom from adjustment, and find extensive applications as functional devices for controlling high-frequency signals. As an example, SAW filters are used as frequency selectors, filter devices, resonators, delay elements and functional devices.

SAW filters control electric high-frequency signals via elastic surface waves propagated along a substrate surface. As the substrate used is usually made of such piezoelectric materials as liquid crystal LBO, lithium tantailate ($LiTaO_3$) and lithium niobate ($LiNbO_3$). Substrates made of piezoelectric material is hereinafter referred to as chip substrate. FIG. 12 shows an SAW filter having a plurality of interdigital transducers (IDTS) 11 to 14, which are formed on a chip substrate 10 by using a thin film forming technique or a lithographic technique.

The SAW filter has a pair of interdigital transducers or a plurality of pairs of interdigital transducers juxtaposed in the direction of progress of elastic surface wave. In the example shown in FIG. 12, two pairs of interdigital transducers are provided. In surface wave propagation path as a region with the interdigital transducers 11 to 14 provided therein, the SAW filter converts an elastic surface are to an electric high frequency signal or converts an electric high frequency signal to an elastic surface wave and selects a frequency dependent on the line width of the interdigital transducers 11 to 14.

The SAW is usually used in a state accommodated in a package. An SAW filter in the state accommodated in a package is hereinafter referred to as SAW filter device. The interdigital transducers 11 to 14 are connected by bonding wires or the like to input or output signal electrode terminals provided on the package accommodating the SAW filter. In the SAW filter shown in FIG. 12, the interdigital transducers 11 and 14, for instance, are connected as an input and an output signal electrode to an input and an output signal electrode terminal, respectively. Also, the interdigital transducers 12 and 13 are connected as grounding electrodes to grounding electrode terminals.

Since the piezoelectric material has pyroelectricity, when the SAW filter device experiences a sudden temperature change in such ambient circumstances as when it is reflow soldered to mount it in a printed circuit board or the like or when its thermal shock test is done, it is subject to polarization and generation of charge on the surface of the chip substrate 10. Such charge generated on the surface of the chip substrate 10 generates an electric field in the interdigital transducers. When the electric field generated in a portion subject to utmost charge concentration reaches the electric breakdown level, electric discharge is caused among the interdigital transducers and, in the extreme case, destruction of the interdigital transducers due to the electric discharge occurs.

To prevent the electric discharge among the interdigital transducers, a ceramic package 91, as shown in FIG. 13, is used to accommodate the SAW filter. The package has a metal film 92 formed by plating or deposition on its inner bottom surface. More specifically, the ceramic package 91 used for accommodating the SAW filter 100 is such that the bottom surface of the chip substrate of the SAW filter 100 is in contact with the metal film 92 when the SAW filter 100 is accommodated. Thus, the grounding electrodes of the SAW filter are electrically connected to the metal film 92. In this package, charge generated, if any, due to polarization can escape to the metal film 92, thus preventing the destruction of the interdigital transducers 11 to 14.

A plastic package may be used to reduce the cost of the SAW filter. However, it is difficult to form a metal film by plating or deposition on the plastic package. That is, it is difficult to provide, on the package, a means for permitting escape of charge generated due to polarization. It is therefore inevitable, as shown in FIG. 14, that the SAW filter be packaged without presence of any metal film between plastic package 7 and SAW filter 100. In order that the plastic package 7 can be used, it is important that the structure of the chip substrate of the SAW filter 100 is free from polarization or capable of permitting escape of charge generated due to polarization.

SUMMARY OF THE INVENTION

An object of the present invention, accordingly, is to provide an SAW filter device, which has a structure capable of preventing destruction of the interdigital transducers by charge generated on the chip substrate due to polarization in such case as when mounting the SAW filter on substrate or when testing the same.

Another object of the present invention is to provide a package for accommodating an SAW filter, which is a plastic package and, nevertheless, is capable of permitting escape of charge generated due to polarization.

An SAW filter device with a chip substrate of a piezoelectric material having a plurality of interdigital transducers and accommodated in a plastic package according to the present invention, wherein a common potential means for providing a common potential in the interdigital transducers, a charge neutralizing means for neutralizing charge generated on the chip substrate due to polarization, or a charge escape means for causing escape of charge generated on the chip substrate due to polarization, is provided as an electric discharge preventing means for preventing electric discharge among the plurality of interdigital transducers on the chip substrate.

With the electric discharge preventing means provided on the chip substrate, it is possible, without provision of any measure for preventing electric discharge on the package side, to permit neutralization or escape of charge generated due to polarization in such case as when mounting the SAW filter on substrate or when testing the SAW filter device. This permits accommodation of the SAW filter in the plastic package. That is, it is possible even in the case of using a plastic package to prevent destruction of the interdigital transducers due to charge generated by polarization.

A package for accommodating an SAW filter in the inside according to the present invention, which comprises a terminal member made of a metal extending out of the package and extending into the package such as to form an L-shaped portion. Thus, it is possible to accommodate the SAW filter in the package such that the bottom surface of the chip substrate is in contact with the metal plate portion. Charge generated due to polarization thus is not concentrated on the side of the SAW filter chip substrate surface but is neutralized. This means that such status as charge concentration on particular potions of the interdigital transducers can be avoided. Consequently, it is possible to prevent electric discharge among the interdigital transducers.

SAW filter device according to a preferable embodiment has a SAW filter having the electric discharge preventing means formed on the chip substrate and accommodated in the above package. Since the bottom surface of the chip substrate is in contact with the metal plate portion, charge generated due to polarization thus is not concentrated on the side of the SAW filter chip substrate surface but is neutralized.

Other objects and features will be clarified from the following description with reference to attached drawings.

PREFERRED EMBODIMENTS OF THE INVENTION

Preferred embodiments of the present invention will now be described with reference to the drawings.

FIG. 1(A) is a plan view showing a first embodiment of the SAW filter according to the present invention, and FIG. 1(B) is a sectional view taken along line B—B in FIG. 1(A). The first embodiment of the SAW filter has interdigital transducers 11 to 13, which are formed from an Al (aluminum) thin film or an Al alloy thin film on a chip substrate 1 of a piezoelectric material, such as lithium tantalate ($LiTaO_3$), lithium niobate ($LiNbO_3$), etc. A high resistivity thin film 2 providing a high electric resistance is formed such that it intervenes between the chip substrate 1 and the interdigital transducers 11 to 14.

The interdigital transducers 11 to 14 are connected by bonding wires (not shown) or the like to an input and an output signal electrode terminal and grounding electrode terminals provided on a package, which accommodates the SAW filter. For example, the interdigital transducers 13 and 12 are connected as input and output signal electrodes to the input and output signal electrode terminals, respectively. The interdigital transducers 11 and 14 are connected as the grounding electrodes to the grounding electrode terminals.

The high resistivity thin film 2 is made of a material having a high resistance of the order of megaohms or more, such as Ti (titanium), Si (silicon), etc. It is further possible to use SiO2 as the high resistivity thin film. The high resistivity thin film 2 has a thickness of the order of several hundred angstroms (i.e., of the order of $10^{-2}$ micrometers).

The high resistivity thin film 2 is formed by deposition or sputtering on the chip substrate 1. The interdigital transducer material is formed by, for instance, sputtering Al. Then, a photo-resist is coated, and patterned by an exposure device or the like. After the photo-resist on unnecessary portions is removed, the interdigital transducers 11 to 14 are formed. Alternatively, after forming the high resistivity thin film 2 on the chip substrate 1, a predetermined photo-resist may be provided, and then the interdigital transducer material, such as Al may be formed. The SAW filter as shown in FIG. 1 can be obtained by the above described process.

Figure 1:
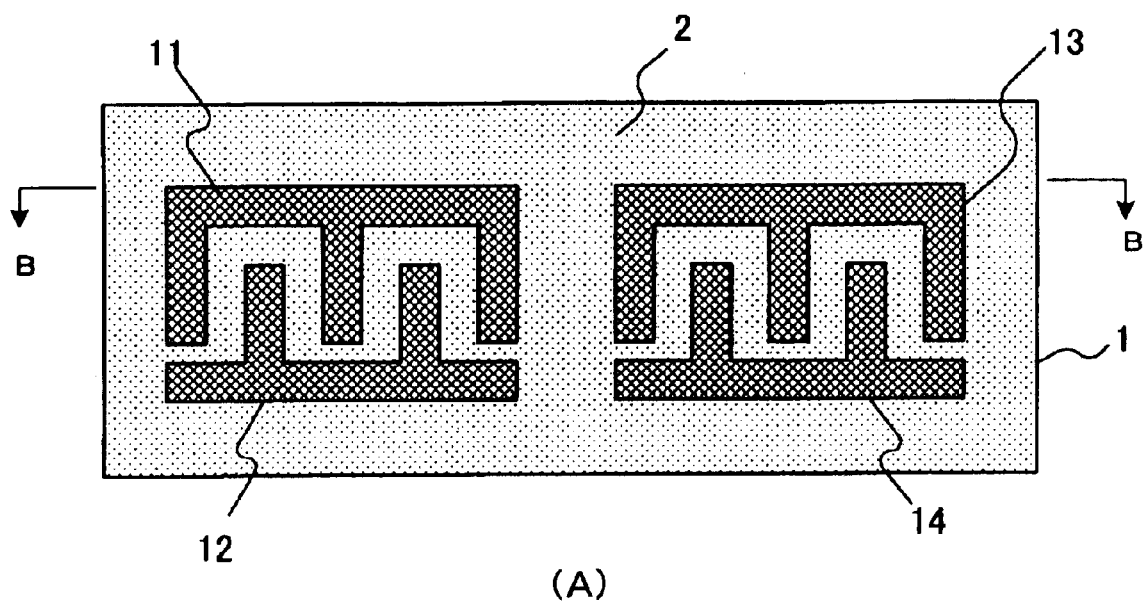
FIGS. 1(A) and 1(B) are a plan view and a sectional view taken along line B—B in FIG. 1(A) showing a first embodiment of the SAW filter according to the present invention.
Figure 1:
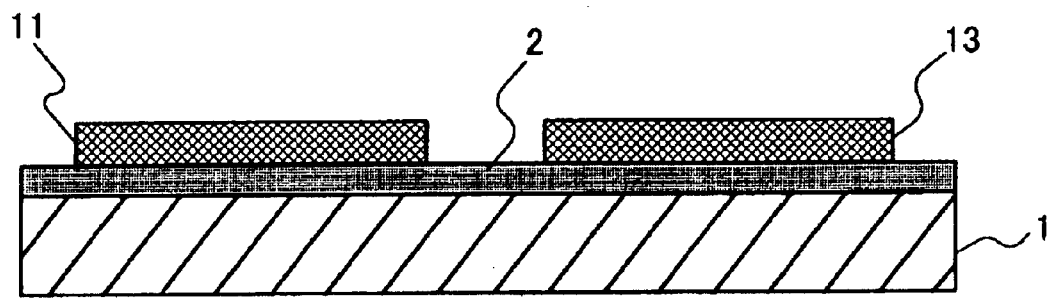

In the SAW filter shown in FIG. 1, the high resistivity film 2 is connected to all the interdigital transducers 11 to 14. When reflow soldering a package accommodating the above SAW filter for assembling to communication equipment or the like and when thermal shock testing the SAW filter, the SAW filter is subject to charge generation due to polarization brought about by a pyroelectric effect. Since the interdigital transducers 11 to 14 are held at the same potential, when charge is generated due to polarization, electric discharge among the interdigital transducers 11 to 14 can be prevented and destruction of the interdigital transducers 11 to 14 can be prevented.

The high resistivity thin film 2 is formed on the surface of the chip substrate 1 of a piezoelectric material. This has an effect of neutralizing charge generated due to polarization. It is thus possible to avoid charge concentration on particular portions of the interdigital transducers 11 to 14. This also has an effect of preventing electric discharge among the interdigital transducers 11 to 14. Thus, with the high resistivity thin film 2 formed between the chip substrate 1 and the interdigital transducers 11 to 14 to have the interdigital transducers 11 to 14 at the same potential and also with the charge neutralizing action, it is to more reliably prevent the destruction of the interdigital transducers 11 to 14 by charge generated due to polarization.

Thus, with the SAW filter of the structure shown in FIGS. 1(A) and 1(B) accommodated in the plastic package, it is possible, without any measure on the package side, to prevent the destruction of the interdigital transducers 11 to 14 due to the pyroelectric effect of the chip substrate 1. In other words, the structure shown in FIGS. 1(A) and 1(B) is particularly effective when using the plastic package for accommodating the SAW filter. The high resistivity thin film 2 is very thin, and thus it has only ignorable effect in the elastic surface wave.

Figure 2:
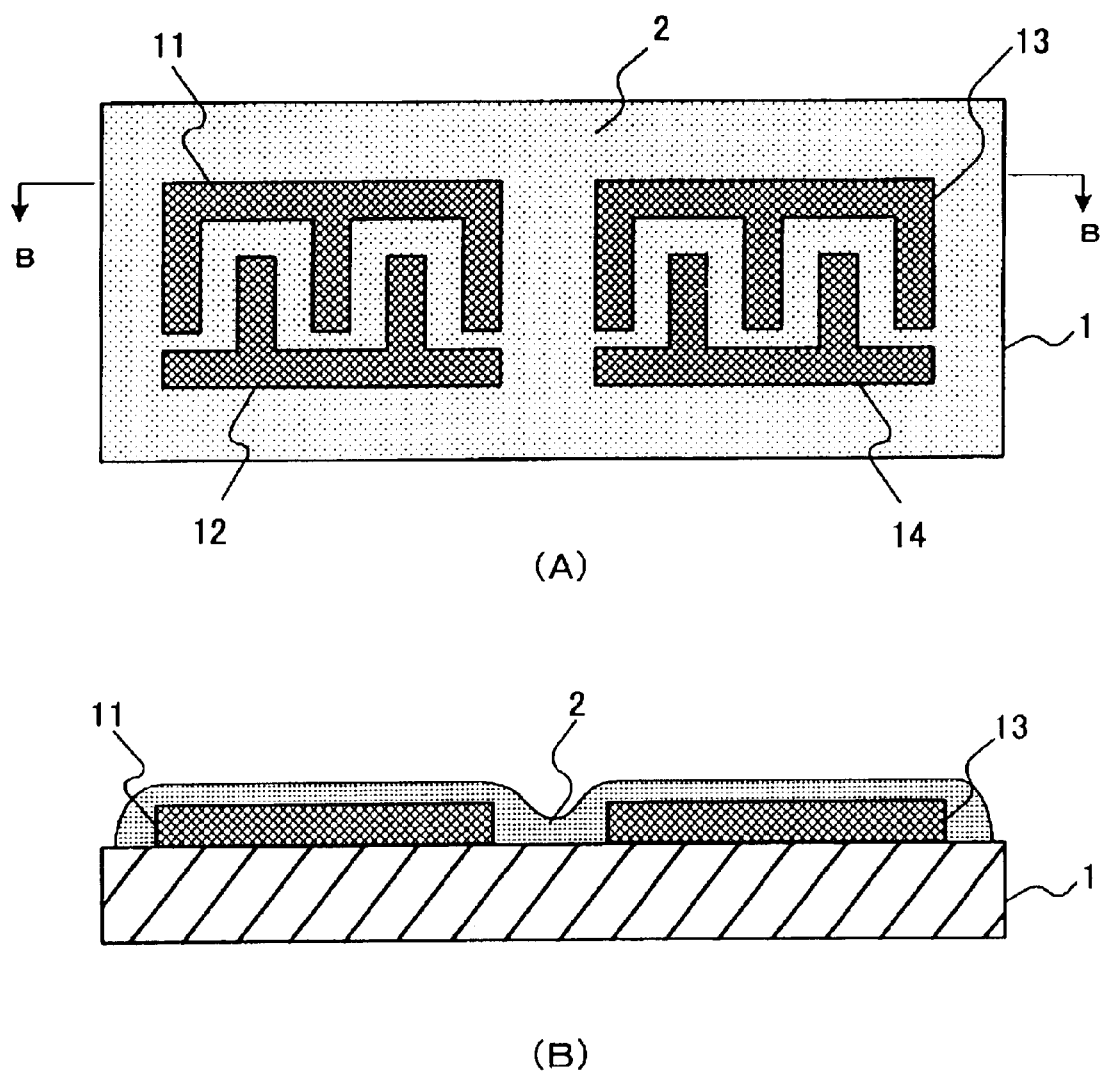
FIGS. 2(A) and 2(B) are a plan view and a sectional view taken along line B—B in FIG. 1(A) showing a second embodiment of the same filter according to the present invention.

FIG. 2(A) is a plan view showing a second embodiment of the same filter according to the present invention. FIG. 2(B) is a sectional view taken along line B—B. The second embodiment of the SAW filter, which has interdigital transducers 11 to 14 formed on the chip substrate 1 of a piezoelectric material, also has a high resistivity thin film 2 formed such as to entirely cover the interdigital transducers 11 to 14 and having a high electric resistance. The material and thickness of the high resistivity thin film 2 may be the same as those in the first embodiment.

As an example, after the formation of the interdigital transducers 11 to 14 on the chip substrate 1 by a sputtering technique or a photo-lithographic technique, the high resistivity thin film 2 is formed by deposition or sputtering on the front surface of the chip substrate 1. As an alternative, it is possible to form the interdigital transducers 11 to 14 on the chip substrate 1 after the formation of the high resistivity thin film 2.

Again in the SAW filter shown in FIGS. 2(a) and 2(b), the high resistivity thin film 2 is in contact with all the interdigital transducers 11 to 14. The interdigital transducers 11 to 14 thus can be held at the same potential. Since the interdigital transducers 11 to 14 are at the same potential at the time of the reflow soldering or a thermal shock test, it is possible to prevent electric discharge among the interdigital transducers 11 to 14. Thus, the structure shown in FIGS. 2(A) and 2(B) is capable of preventing the destruction of the interdigital transducers 11 to 14.

Furthermore, in the SAW filter having the structure as shown in FIGS. 2(A) and 2(B), the high resistivity thin film 2 is in contact with the chip substrate 1 of the piezoelectric material in a portion where the interdigital transducers 11 to 14 are not formed. It is thus possible to expect an effect of neutralizing charge generated due to polarization. Again in this embodiment, it is thus possible to avoid charge concentration on particular portions of the interdigital transducers 11 to 14.

Thus, with the SAW filter having the structure as shown in FIGS. 2(A) and 2(B) accommodated in the plastic package, it is possible, without any measure in the package side, to prevent destruction of the interdigital transducer 11 to 14 due to the pyroelectric effect on the chip substrate 1. That is, the structure shown in FIGS. 2(A) and 2(B) is particularly effective in the case of using the plastic package for accommodating the SAW filter. The high resistivity thin film 2 is very thin, and its effect on elastic surface wave is ignorable.

FIG. 3(A) is a plan view showing a third embodiment of the SAW filter according to the present invention. FIG. 3(B) is a sectional view taken along line B—B in FIG. 3(A). The third embodiment of the SAW filter, which has interdigital transducers 11 to 14 on chip substrate 1 of a piezoelectric material, also has a conductive layer 3 formed on the chip substrate 1 over the entire area of the back surface (i.e., surface opposite the surface with the interdigital transducers 11 to 14 formed thereon. The conductive material layer 3 is made of, for instance Al or Ti. Since no interdigital transducer is formed on the back surface of the chip substrate 1, it is possible to use Al or like metal as the conductive material layer 3.

With the conductive material, film 3 formed as cover film on the back surface of the chip substrate 1, it is expected that charge generated due to polarization 3 is neutralized without being concentrated on the front surface side of the chip substrate 1. It is thus possible to avoid charge concentration on particular portions of the interdigital transducers 11 to 14. Electric discharge among the interdigital transducers 11 to 14 can be avoided.

Figure 3:
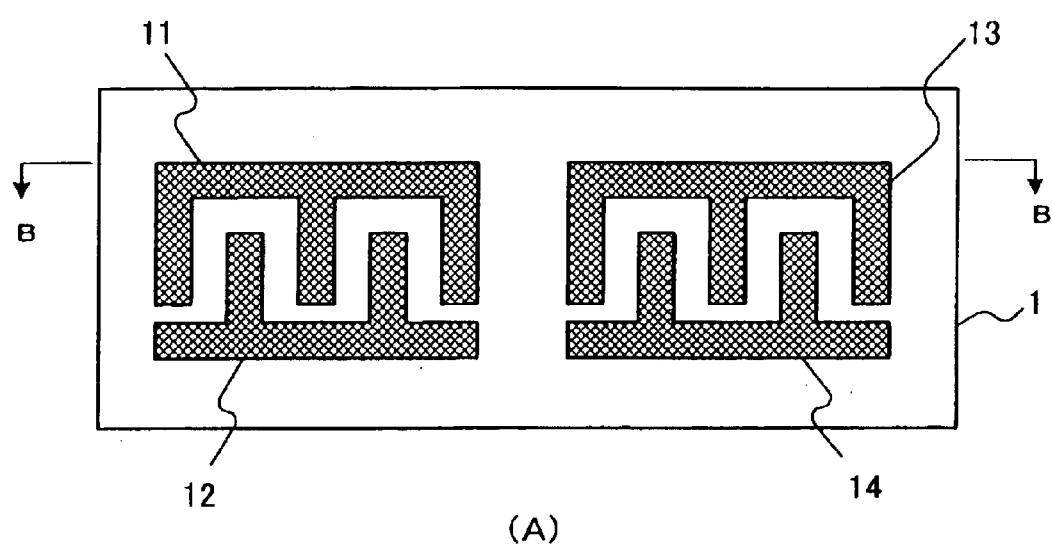
FIGS. 3(A) and 3(B) are a plan view and a sectional view taken along line B—B in FIG. 1(A) showing a third embodiment of the SAW filter according to the present invention.
Figure 3:
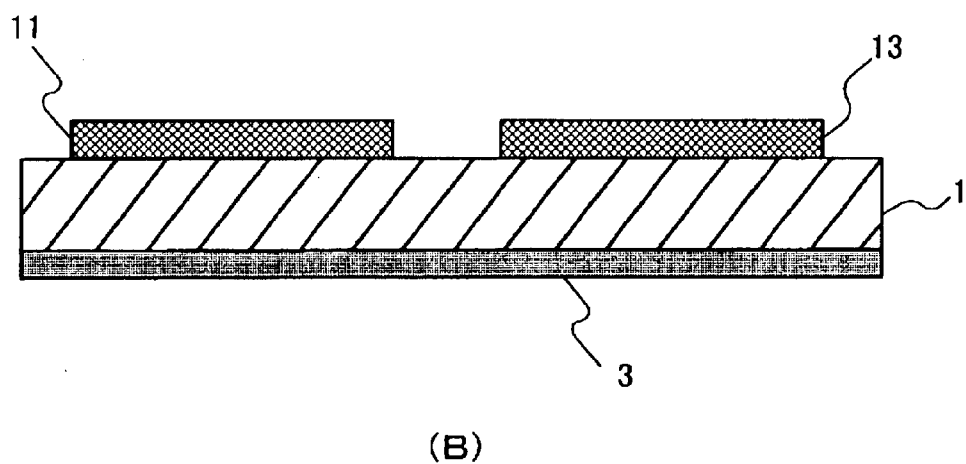

With the SAW filter of the structure as shown in FIG. 3 accommodated in the plastic package, it is possible, without any measure on the package side, to prevent destruction of the interdigital transducers 11 to 14 due to pyroelectric effect in the chip substrate 1. Thus, the structure shown in FIGS. 3(A) and 3(B) is particularly effective in the case of using the plastic package accommodating the SAW filter.

Figure 4:
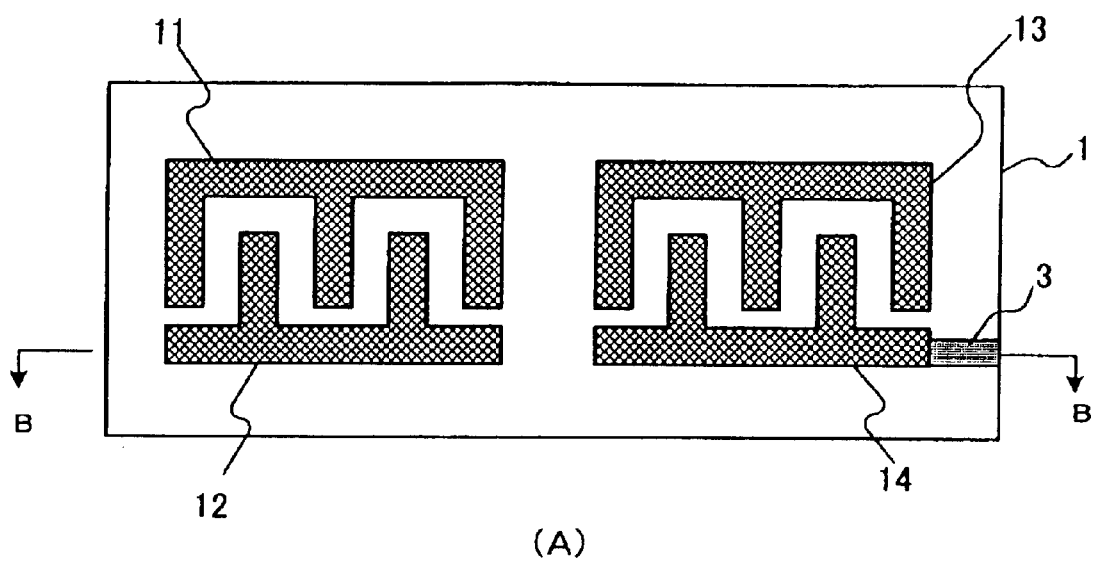
FIGS. 4(A) and 4(B) are a plan view and a sectional view taken along line B—B in FIG. 1(A) showing a fourth embodiment of the SAW filter according to the present invention.
Figure 4:
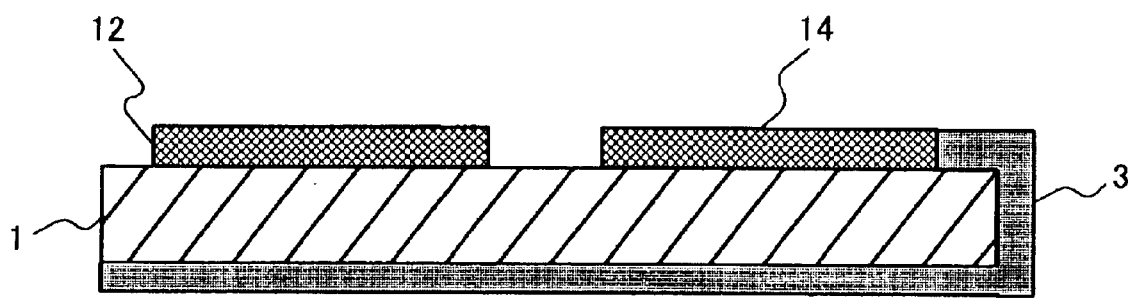

FIG. 4(A) is a plan view showing a fourth embodiment of the SAW filter according to the present invention. FIG. 4(B) is a sectional view taken along line B—B. The fourth embodiment of the SAW filter, which has interdigital transducers 11 to 14 formed on chip substrate 1 of a piezoelectric material, also has a conductive material film 3, which is formed as cover film on the entire area of the back surface of the chip substrate 1 of a piezoelectric material and also has a connecting film portion for electrically connecting the metal film on the back surface of the chip substrate 1 to an interdigital transducer serving as a grounding electrode. In the example shown in FIGS. 4(A) and 4(B), the conductive material film portion 3 electrically connects the metal film to the interdigital transducer 14.

With the conductive material film 3 formed as cover film on the back surface of the chip substrate 1 and also with the interdigital transducer and the conductive cover film connected to each other by the connecting film portion 3, it can be expected to be able to neutralize charge generated due to the pyroelectric effect, and also it is possible to permit charge generated due to polarization to escape via the interdigital transducer to the conductive cover film. It is thus possible to more effectively avoid charge concentration on particular portions of the interdigital transducers 11 to 14. Thus, electric discharge among the interdigital transducers 11 to 14 can be more effectively prevented.

Thus, with the SAW filter having the structure as shown in FIGS. 4(A) and 4(B) accommodated in the plastic package, it is possible, without any measure on the package side, to prevent the destruction of the interdigital patterns 11 to 14 due to pyroelectric effect on the chip substrate 1. That is, the structure shown in FIGS. 4(A) and 4(B) is particularly effective in the case of using the plastic package for accommodating the SAW filter. With the SAW filter having the structure shown in FIGS. 4(A) and 4(B) accommodated in the ceramic package, it is possible to prevent the destruction of the interdigital transducers 11 to 14 without need of any measure such as formation of a metal film on the bottom surface of the ceramic package.

Figure 5:
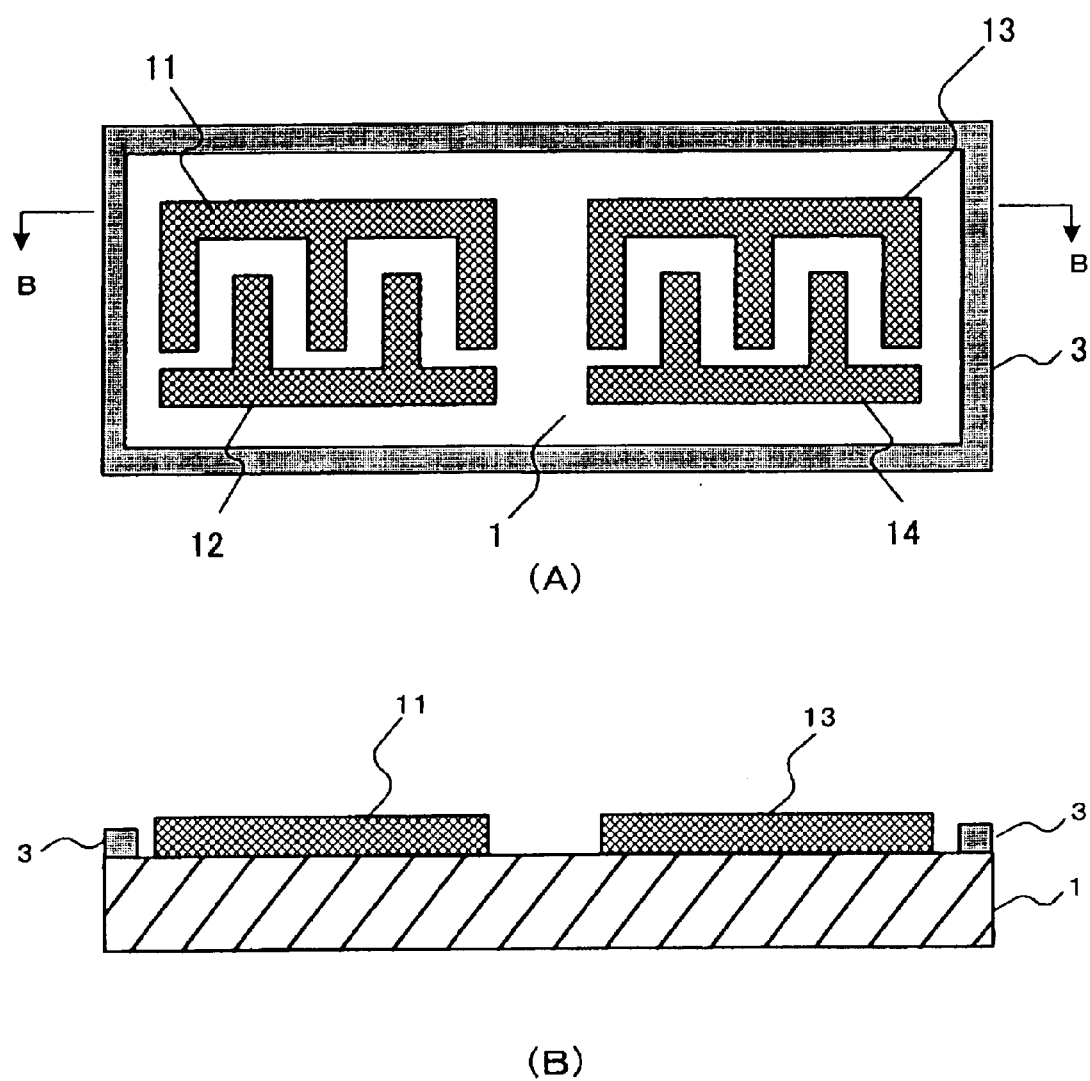
FIGS. 5(A) and 5(B) are a plan view and a sectional view taken along line B—B in FIG. 1(A) showing a fifth embodiment of the fifth embodiment of the SAW filter according to the present invention.

FIG. 5 (A) is a plan view showing a fifth embodiment of the SAW filter according to the present invention. FIG. 5(B) is a sectional view taken along line B—B. The fifth embodiment of the SAW filter, which has the interdigital patterns 11 to 14 formed on the chip substrate 1 of a piezoelectric material, also has a film 3 of a metal or like conductive material covering an edge portion of the front surface of the chip substrate 1. The conductive material from 3 does not cover the portion constituting a surface wave propagation path in the SAW filter.

With the conductive material film 3 formed on the edge portion of the front surface of the chip substrate 1, charge generated, if any, due to polarization escapes to the side of the conductive material film and does not concentrate on the portions of the interdigital transducers 11 to 14. That is, it is possible to avoid charge concentration on particular portions of the interdigital transducers 11 to 14, thus preventing electric discharge among the interdigital transducers 11 to 14. Since it is possible to avoid charge concentration on particular portions, it can be thought that the conductive material film 3 fulfills the action of neutralizing charge in the chip substrate 1.

Thus, with the SAW filter having the structure as shown in FIG. 5, it is possible, without any measure on the package side, to prevent destruction of the interdigital transducers 11 to 14 due to the pyroelectric effect of the chip substrate 1. In other words, the structure shown in FIG. 5 is particularly effective in the case of using the plastic package for accommodating the SAW filter. With the SAW filter of the structure shown in FIG. 5 accommodated in the ceramic package, it is possible to prevent destruction of the interdigital transducers 11 to 14 without need of such measure as forming a metal film on the bottom surface of the ceramic package.

Figure 6:
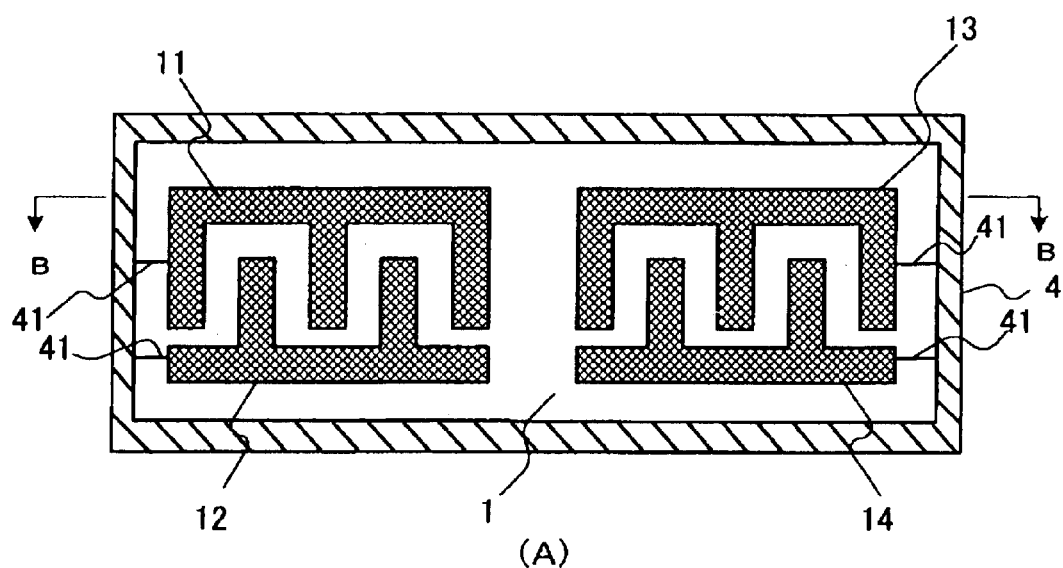
FIGS. 6(A) and 6(B) are a plan view and a sectional view taken along line B—B in FIG. 1(A) showing a sixth embodiment of the SAW filter according to the present invention.
Figure 6:
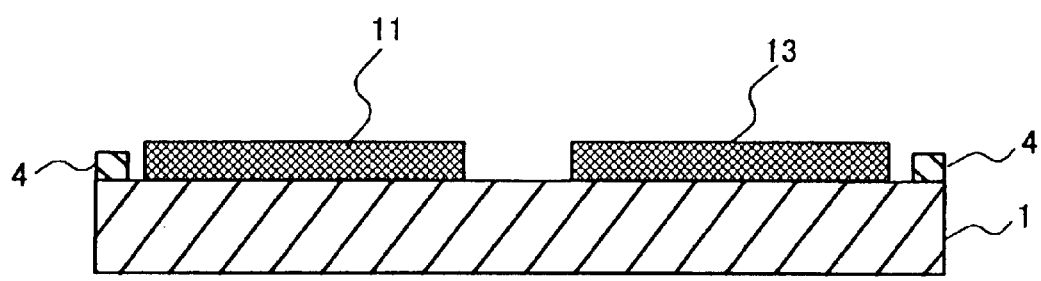

FIG. 6(A) is a plan view showing a sixth embodiment of the SAW filter according to the present invention. FIG. 6(B) is a sectional view taken along line B—B. In the sixth embodiment of the SAW filter, which has interdigital transducers 11 to 14 formed on chip substrate 1 of a piezoelectric material, the interdigital transducers 11 to 14 are interconnected by thin patterns 41 having a high resistance such as Ti.

In the example shown in FIGS. 6(A) and 6(B), a pattern 4 having a high resistance (high resistance pattern) is formed on an edge portion of the front surface of the chip substrate 1. The patterns 41 are each connected to the high resistance pattern 4 for interconnecting the interdigital transducers 11 to 14. The high resistance pattern 4 is of the same material as the patterns 41. The high resistance pattern 4 does not cover the portion constituting the surface wave propagation path of the SAW filter. The patterns 41 have such a thickness as not to affect the elastic surface wave.

In the SAW filter shown in FIGS. 6(A) and 6(B), the interdigital transducers 11 to 14 which are interconnected, are held at the same potential, and thus it is possible to prevent electric discharge among the interdigital transducers 11 to 14. Thus, it is possible to prevent destruction of the interdigital transducers 11 to 14.

Thus, with the SAW filter having the structure shown in FIGS. 6(A) and 6(B) accommodated in the plastic package, it is possible, without any measure on the package side, to prevent destruction of the interdigital transducers 11 to 14 due to pyroelectric effect on the chip substrate 1. That is, the structure shown in FIGS. 6(A) and 6(B) are particularly effective in the case of using the plastic package for accommodating the SAW filter. With the SAW filter having the structure as shown in FIGS. 6(A) and 6(B) accommodated in the ceramic package, it is possible to prevent destruction of the interdigital transducers 11 to 14 without need of such measure as forming a metal film on the bottom surface of the ceramic package.

Figure 7:
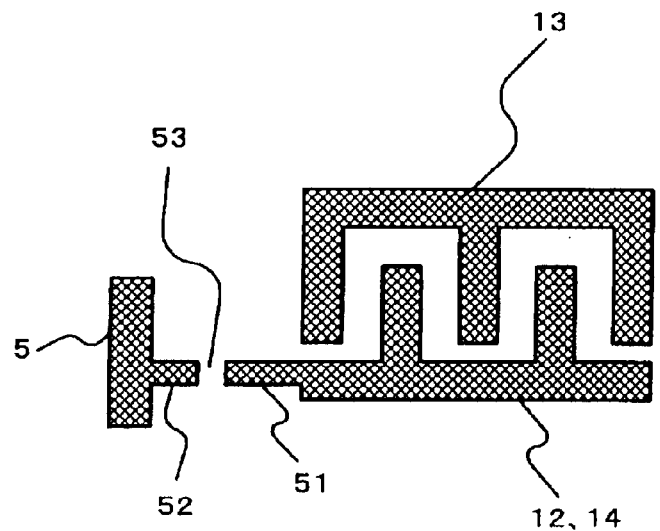
FIG. 7 is a plan view showing a portion of a seventh embodiment of the SAW filter according to the present invention.

FIG. 7 is a plan view showing a portion of a seventh embodiment of the SAW filter according to the present invention. As shown in FIG. 7, the seventh embodiment of the SAW filter, which again has interdigital transducers 11 to 14 on chip substrate 1 of a piezoelectric material, the interdigital transducers 12 and 14 each have an extension extending on the front surface of the chip substrate 1 and forming a pattern as a first pattern 51. In FIG. 7, only one of two interdigital transducers are shown.

Patterns as second patterns 52 having the same line width as the first pattern 51, are formed such that each forms a gap 53 formed between it and the first pattern 51. Dummy electrode patterns 5 are formed such that they are each connected to each pattern 52. The gaps 53 have a width (i.e., the spacing between the patterns 51 and 52 is narrower than the spacing between each of the interdigital transducer 12 and 14. The patterns 51 and 52 have a line width narrower than the pattern width of the interdigital transducers 11 to 14.

In the SAW filter as shown in FIG. 7, in which the gaps 53 have a width narrower than the spacing between each of the interdigital transducers 11 and 13 and each of the interdigital transducers 12 and 14, when electric discharge is generated by charge generation due to polarization of the chip substrate 1, electric discharge is generated across the gaps 53. Thus, it is possible to prevent electric discharge among the interdigital transducers 11 to 14, thus preventing destruction thereof.

Thus, with the SAW filter of the structure as shown in FIG. 7 accommodated in the plastic package, it is possible, without any measure on the package side, to prevent destruction of the interdigital transducers 11 to 14 due to pyroelectric effect of the chip substrate 1. That is, the structure shown as in FIG. 7 is particularly effective in the case of using the plastic package for accommodating the SAW filter. With the SAW filter having the structure as shown in FIG. 7 accommodated in the ceramic package, it is possible to prevent destruction of the interdigital transducers 11 to 14, without need of such measure as forming a metal film on the bottom surface of the ceramic package.

Although electric discharge across the gaps 53 gives rise to electric noise generation, charge is generated due to polarization at the time of reflow soldering, thermal shock test, etc. and not in the duty service state of the SAW filter. Thus, the electric noise generation gives rise to no problem.

Figure 8:
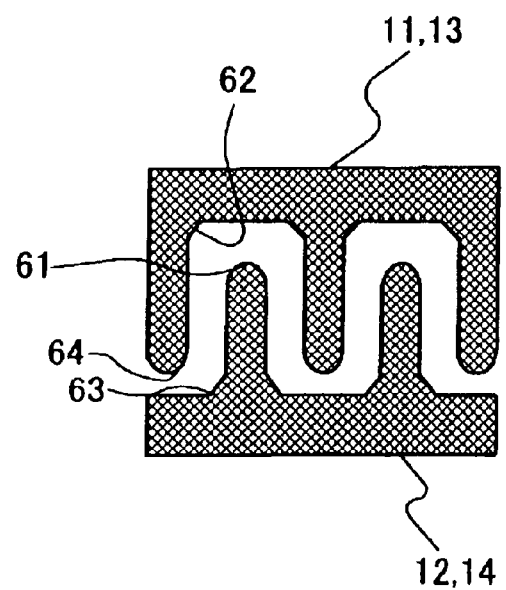
FIG. 8 is a plan view showing a portion of an eighth embodiment of the SAW filter according to the present invention

FIG. 8 is a plan view showing a portion of an eighth embodiment of the SAW filter according to the present invention. As shown in FIG. 8, in the eighth embodiment of the SAW filter, which again has interdigital transducers 11 to 14 formed on chip substrate 1 of a piezoelectric material, the interdigital transducers 11 to 14 have rounded ends and corners. Specifically, in the interdigital transducers 11 to 14, pair interdigital transducers have rounded opposed portions 61 to 64.

Since the opposed portions 61 to 64 of the interdigital transducers are not sharp, in the event of charge generation due to polarization in the chip substrate 1, electric discharge is difficultly generated among the interdigital transducers. It is thus possible to prevent electric discharge among the interdigital transducers 11 to 14, thus preventing destruction thereof.

Thus, with the SAW filter having the structure as shown in FIG. 8 accommodated in the plastic package, it is possible, without any measure on the package side, to prevent destruction of the interdigital transducers 11 to 14 due to pyroelectric effect in the chip substrate 1. That is, the structure shown in FIG. 8 is particularly effective in the case of using the plastic package for accommodating the SAW filter. With the SAW filter shown in FIG. 8 accommodated in the ceramic package, it is possible to prevent destruction of the interdigital transducers 11 to 14 without need of forming any metal film in the bottom surface of the ceramic package.

The structures adopted in the first to eighth embodiments are capable, without any measure on the package side, of preventing destruction of the interdigital transducers 11 to 14 due to pyroelectric effect of the chip substrate 1. However, it is possible to combine two or more structures adopted in the first to eighth embodiments. In the case of combining a plurality of structures, it is possible to reliably prevent destruction of the interdigital transducers 11 to 14 due to pyroelectric effect.

In the structures adopted in the first to fifth embodiments, a charge neutralizing means for effecting the action of charge neutralization or charge dispersion can be realized. In the first and second embodiments 1 and 2 a common potential means is realized together with a charge neutralizing means, and in the fourth and fifth embodiments a charge escape means is realized together with the charge neutralizing means. In the structure adopted in the sixth embodiment, a common potential means is realized.

FIG. 9(A) is a plan view showing an example of package suited for accommodating the SAW filter. FIG. 9(B) is a plan view taken along line B—B. FIG. 9(C) is a sectional view taken along line C—C. In FIG. 9(C) pads 71a to 76a which are not shown in FIG. 9(C), for clarifying the connecting relation between the pads and terminals are shown. A package 7 is a one-piece plastic molding. In the example shown in FIGS. 9(A) to 9(C), the package 7 has a rectangular planar shape, and has an edge wall. The package 7 further has a central rectangular recess 78 for disposing the SAW filter therein.

The package 7 has a plurality of pads 71a to 76a formed on a portion 79 defined between the edge wall 77 and the central recess 78. The package 7 further has metal terminals 71 to 76 extending from its inside to the outside. Of the terminals 71 to 76, the terminal 74 is used as a grounding terminal (GND terminal). The pads 71a to 76a are formed such that they are integral with the corresponding terminals 71 to 76.

The GND terminal 74 extends into the package 7, and has a longitudinally extending portion (longitudinal portion) and a laterally inwardly extending portion (lateral portion). The longitudinally extending portion and a laterally inwardly extending portion Of GND terminal 74 forms an (L-shaped) metal portion 80 exposed in the recess 78 in the package 7. In the example shown in FIGS. 9(A) to 9(C) only a single GND terminal 74 is provided, but it is also possible to provide a plurality of GND terminals. For example, in the case with the provision of two GND terminals, each GND terminal formed to be integral with the L-shaped portion 80 in the recess 7. In this case, the L-shaped portion 80 exposed in the recess 78 is supported in two portions, and a more stable posture of the L-shaped portion 80 can be obtained.

Figure 9:
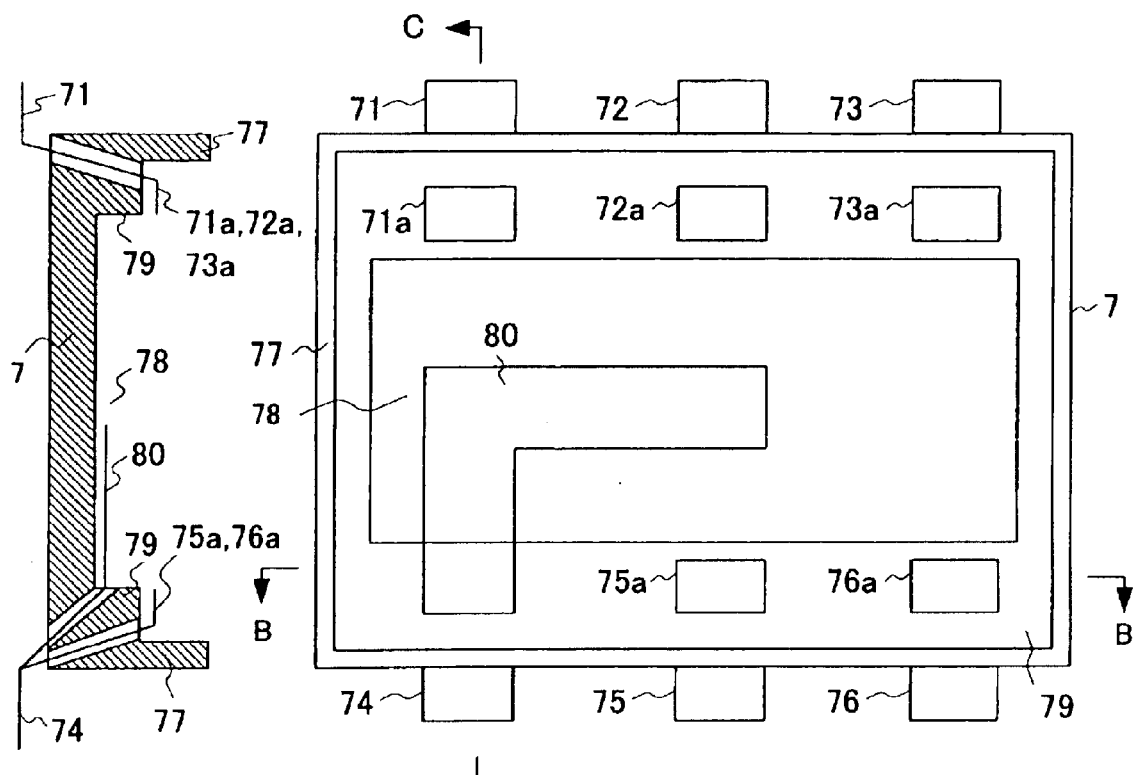
FIGS. 9(A), 9(B) and 9(C) are a plan view showing an example of package suited for accommodating the SAW filter, a plan view taken along line B—B in FIG. 1(A) and a sectional view taken along line C—C in FIG. 1(A) according to the present invention.
Figure 9:
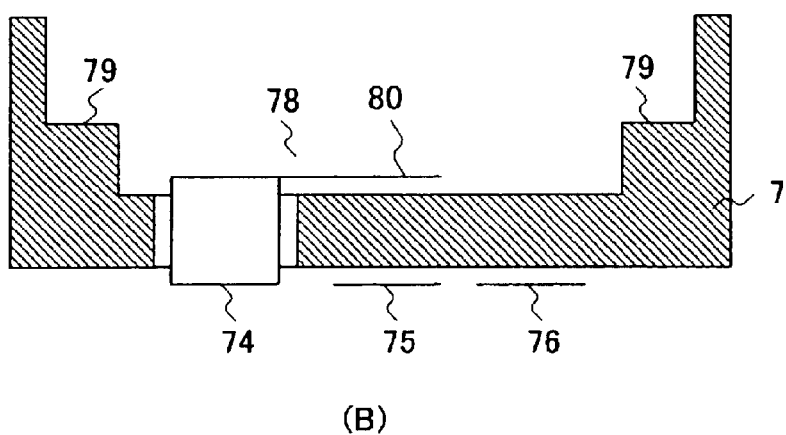
Figure 10:
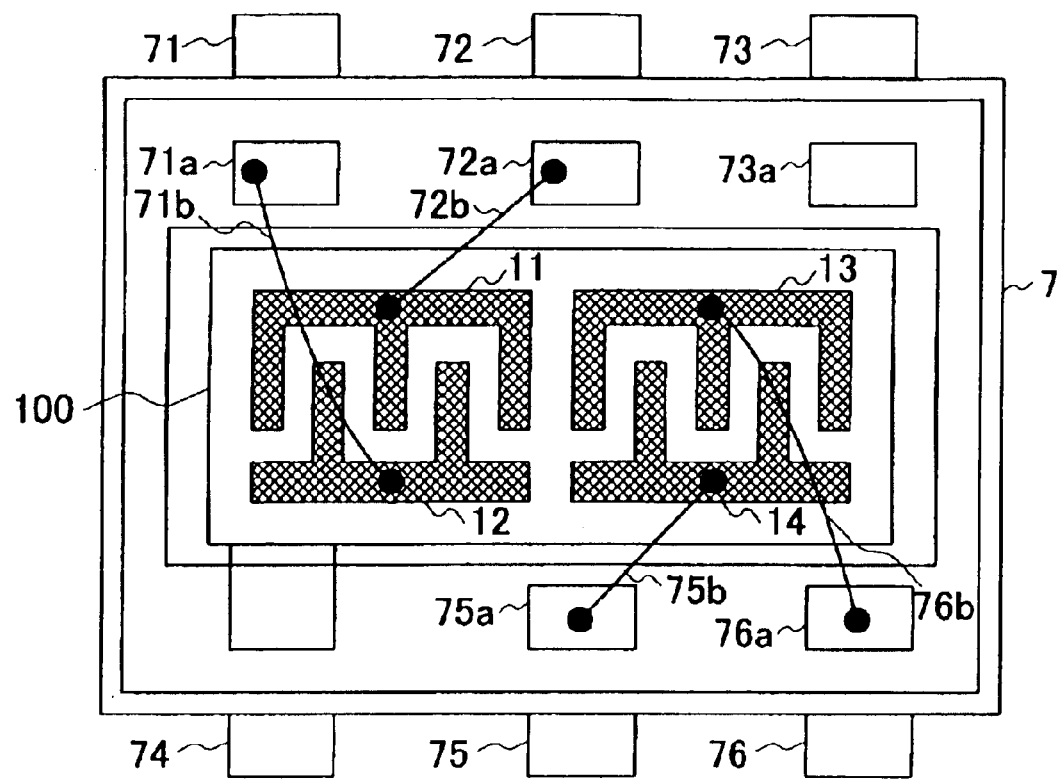
FIG. 10 is a plan view showing how an SAW filter 100 is accommodated in the package 7 shown in FIG. 9.

FIG. 10 is a plan view showing how an SAW filter 100 is accommodated in the package 7 shown in FIG. 9. When accommodating the SAW filter 100 in the package 7, the SAW filter 100 is set in the recess 78 of the package 7 such that the back surface of the chip substrate 1 is in contact with the L-shaped portion 80. Then, the interdigital transducers 11 to 14 and the predetermined pads 71a to 76a are connected to one another with bonding wires 71b to 76b. Then, the top of the package is covered with a plastic or like material.

In the package 7 shown in FIGS. 9(A) to 9(C), the L-shaped metal portion 80 is present. Also, the L-shaped portion 80 is made to be integral with the GND terminal 74. Thus, when the SAW filter 100 is accommodated in the package 7, the metal plate is in contact with the back surface of the chip substrate. This means that when the SAW filter 100 is accommodated in the package 7, a state resembling the state of the third embodiment shown in FIGS. 3(B) and 3(A) is obtained. It is thus expected that charge generated by polarization is neutralized without being concentrated in the front surface of the chip substrate of the SAW filter 100. It is thus possible to avoid charge concentration on particular portions of the interdigital transducers 11 to 14. Thus, it is possible to prevent electric discharge among the interdigital transducers 11 to 14.

Also, by connecting the GND terminal 74 on the outside of the package 7 (for instance, on a printed circuit board), it is possible to connect the GND terminal 74 and the interdigital transducer as grounding electrode to each other. With the GND terminal and the interdigital transducer connected to each other, a state resembling the state of the fourth embodiment shown in FIGS. 4(A) and 4(B) is obtained. In this state, it is possible to expect neutralization of charge generated due to polarization by pyroelectric effect and also permit escape of charge generated due to polarization via the interdigital transducers to the metal film on the back surface of the chip substrate. Thus, it is possible to avoid charge concentration on particular portions of the interdigital transducers 11 to 14.

In other words, by using the package 7 in this embodiment, it is possible to prevent destruction of the interdigital transducers 11 to 14 without any measure on the side of the SAW filter itself against charge generated due to polarization. In the case of accommodating the SAW filter provided with any of the measures in the above first to eighth embodiments in the package 7 shown in FIG. 7, it is possible to more reliably prevent destruction of the interdigital transducers 11 to 14. The SAW filter device, in which the SAW filter in any of the first to eight embodiments in the package 7 shown in FIGS. 9(A) to 9(C), has improved durability against destruction of the interdigital transducers 11 to 14.

In the package 7 shown in FIGS. 9(A) to 9(C), the (L-shaped) metal plate portion 80 is made to be integral with the GND terminal. The L-shaped metal portion 80 thus can be formed by providing a V-shaped metal film as the GND terminal 74 when forming the terminals 71 to 76 on the package 7. That is, the L-shaped portion 80 can be formed concurrently with the formation of the terminals 71 to 76. Thus, the process of forming the package 7 is not complicated. It is thus possible to adopt the structure shown in FIGS. 9(A) to 9(C). In this case, the manufacturing process can be simplified compared to the case of forming the metal film 92 by plating or deposition on the inner bottom surface of the package.

Figure 11:
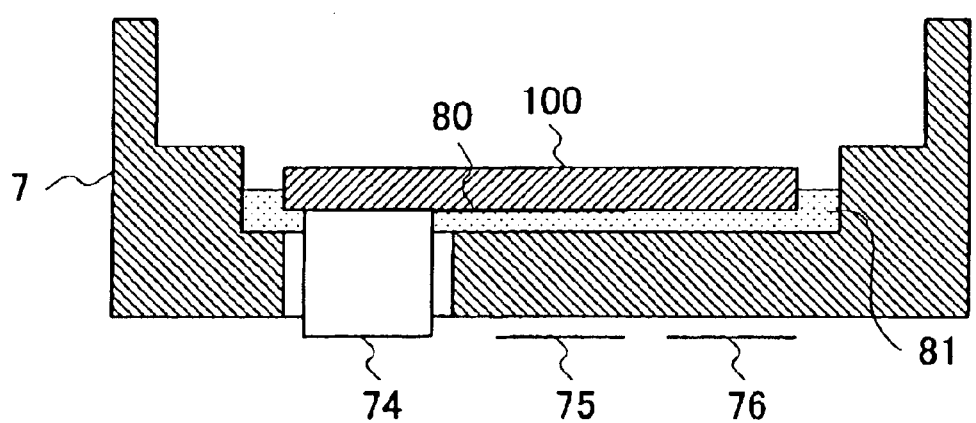
FIG. 11 is sectional view of the package accommodating the SAW filter by conductive adhesive.
Figure 12:
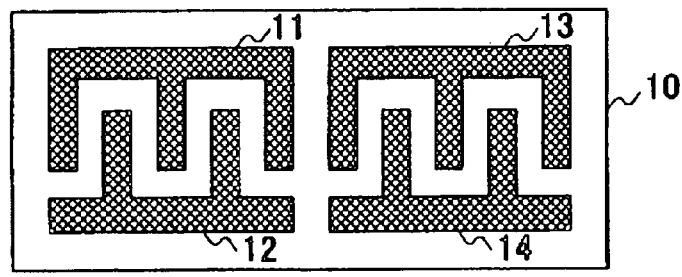
FIG. 12 shows an SAW filter having two pairs of interdigital transducers.
Figure 13:
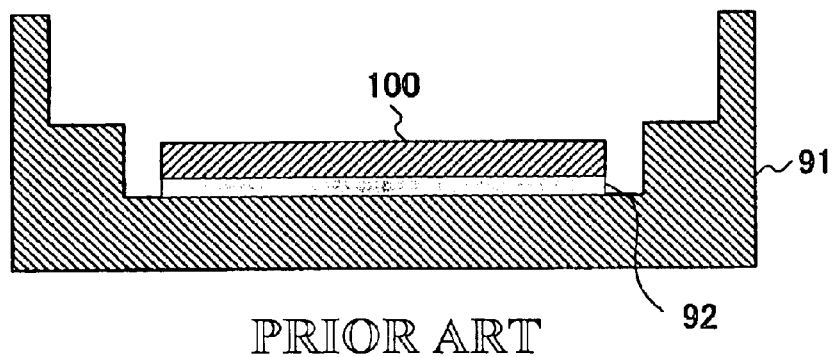
FIG. 13 is a sectional view of the ceramic package accommodating the SAW filter.
Figure 14:
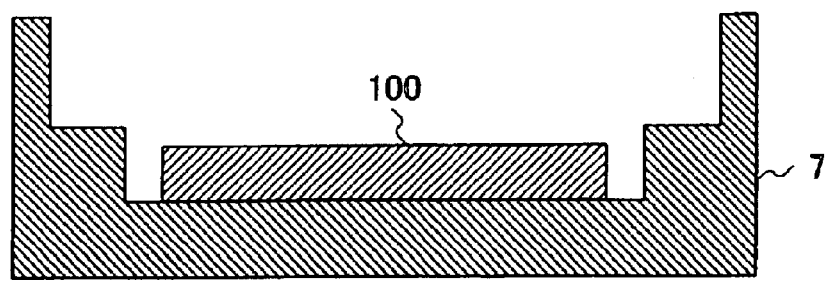
FIG. 14 is a sectional view of the plastic package accommodating the SAW filter.

As shown in FIG. 11, when accommodating the SAW filter 100 in the package 7 shown in FIGS. 9(A) to 9(C), the SAW filter 100 may be secured by conductive adhesive 81 to the package 7. As shown in FIG. 11, since the L-shaped metal portion 80 is located between the SAW filter 100 and the package 7, when the SAW filter 100 is secured by the conductive adhesive to the SAW filter 100, it is possible to obtain firmer connection between the SAW filter 100 and the L-shaped portion 80. It is thus possible to obtain more reliable electric connection between the SAW filter 100 and the L-shaped metal portion 80.

As has been shown, in the first to eighth embodiments, the chip substrate 1 itself of the SAW filter has a structure permitting neutralization or escape of charge generated due to polarization. Thus, with this filter accommodated in the plastic package, it is possible to prevent destruction of the interdigital transducers 11 to 14 irrespective of sudden temperature changes in ambient environment. In other words, in the SAW filter package in which the SAW filter of the structure of any of the embodiments 1 to 8, is accommodated in the plastic package, it is possible to prevent destruction of the interdigital transducers 11 to 14 irrespective of sudden temperature changes. It is thus possible to accommodate the chip structure 1 of the structure of any of the first to eighth embodiments in the plastic package.

In the ninth and tenth embodiments, when accommodating the SAW filter in the package 7, it is possible to form a metal portion in contact with the back surface of the chip substrate without use of plating or deposition. Thus, by using any one of the packages 7 shown in FIGS. 9 and 10, it is possible to prevent destruction of the interdigital transducers 11 to 14 without provision of any measure against charge generated due to polarization on the side of the SAW filter itself. That is, with the accommodation, in the package 7, of an SAW filter with the provision of the measure as described in connection with any of the first to eighth embodiments, it is possible to prevent destruction of the interdigital transducers 11 to 14 in the event of a sudden change in the ambient environment.

As has been described in the foregoing, the SAW filter device according to the invention has a structure in which the chip substrate itself is provided in the electric discharge preventing means, by using even a plastic package without provision of any electric discharge destruction measure it is possible to prevent destruction of the interdigital transducers by charge generated due to polarization at the time of mounting on SAW filter substrate or testing.

In addition, the package for accommodating the SAW filter has the structure having a terminal member extending out of it and also extending into it such as to form an L-shaped portion, it is possible to accommodate the SAW filter in the package such that the back surface of the chip substrate is in contact with the L-shaped metal portion. Consequently, charge generated due to polarization can be neutralized without being concentrated on the front surface of the chip substrate of the SAW filter.

Furthermore, the SAW filter device according to the invention has the structure, in which the SAW filter with the electric discharge preventing means provided on the chip substrate is accommodated in the package of the structure having the terminal member extending out of the package and also extending into the same such as to form the L-shaped portion, the back surface of the chip substrate is in contact with the L-shaped metal portion inside the SAW filter device. Thus, charge generated, if any, due to polarization can be neutralized without being concentrated on the front surface of the chip substrate of the SAW filter.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. A surface acoustic wave (SAW) filter device with a chip substrate of a piezoelectric material, comprising:
   a plurality of interdigital transducers accommodated in a plastic package;
   a terminal member connected to said plastic package, wherein said terminal member comprises a lateral extending portion recessed into said package which contacts the back surface of the chip substrate,
   wherein common potential means for providing a common potential in the interdigital transducers, charge neutralizing means for neutralizing charge generated on the chip substrate due to polarization, or charge escape means for causing escape of charge generated on the chip substrate due to polarization, is provided as electric discharge preventing means for preventing electric discharge among the plurality of interdigital transducers on the chip substrate.

2. The SAW filter device according to claim 1, wherein the electric discharge preventing means comprises a high resistivity thin film provided between the chip substrate and the interdigital transducers and covering the front surface of the chip substrate.

3. An SAW filter device including an SAW filter according to claim 2, which comprises a plastic package including a terminal member comprising metal extending out of the package and extending into the package such as to form an L-shaped portion, the chip substrate being accommodated in the plastic package such that the back surface of the chip substrate is in contact with the L-shaped portion.

4. The SAW filter device according to claim 1, which further comprises a film of a conductive material covering the front surface of the chip substrate and the interdigital transducers.

5. An SAW filter device including an SAW filter according to claim 4, which comprises a plastic package including a terminal member comprising metal extending out of the package and extending into the package such as to form an L-shaped portion, the chip substrate being accommodated in the plastic package such that the back surface of the chip substrate is in contact with the L-shaped portion.

6. The SAW filter device according to claim 1, wherein the electric discharge preventing means comprises a film of a conductive material provided on the front surface side edge portion of the chip substrate.

7. An SAW filter device including an SAW filter according to claim 6, which comprises a plastic package including a terminal member comprising metal extending out of the package and extending into the package such as to form an L-shaped portion, the chip substrate being accommodated in the plastic package such that the back surface of the chip substrate is in contact with the L-shape portion.

8. The SAW filter device according to claim 1, wherein the electric discharge preventing means comprises a high resistivity thin film formed such as to cover the entire interdigital transducer.

9. An SAW filter device including an SAW filter according to claim 8, which comprises a plastic package including a terminal member comprising metal extending out of the package and extending into the package such as to form an L-shaped portion, the clip substrate being accommodated in the plastic package such that the back surface of the chip substrate is in contact with the L-shape portion.

10. The SAW filter device according to claim 1, wherein the electric discharge preventing means comprises opposed portions of the interdigital transducers having non-sharp shapes.

11. An SAW filter device including an SAW filter according to claim 10, which comprises a plastic package including a terminal member comprising metal extending out of the package and extending into the package such as to form an L-shaped portion, the chip substrate being accommodated in the plastic package such that the back surface of the chip substrate is in contact with the L-shaped portion.

12. The SAW filter device according to claim 1, wherein the electric discharge prevention means comprises a high resistivity pattern provided so as to surround the front surface center portion of the chip substrate.

13. An SAW filter device including an SAW filter according to claim 12, which comprises a plastic package including a terminal member comprising metal extending out of the package and extending into the package such as to form an L-shaped portion, the chip substrate being accommodated in the plastic package such that the back surface of the chip substrate is in contact with the L-shaped portion.

14. The SAW filter device of claim 1, wherein said terminal member comprises an L-shaped portion.

15. The SAW filter device of claim 14, wherein the back surface of the chip substrate contacts the L-shaped portion.

16. An SAW filter device with comprising:
  a chip substrate of a piezoelectric material having a plurality of interdigital transducers and accommodated in a plastic package; and
  an electric discharge preventing means for preventing electric discharge among the plurality of interdigital electric patterns, wherein said electric discharge preventing means includes opposed portions of the interdigital transducers having non-sharp shapes.

17. An SAW filter device including an SAW filter according to claim 16, which comprises a plastic package including a terminal member comprising metal extending out of the package and extending into the package such as to form an L-shaped portion, the chip substrate being accommodated in the plastic package such that the back surface of the chip substrate is in contact is in contact with the L-shaped portion.

18. A surface acoustic wave (SAW) filter device with a chip substrate of a piezoelectric material, comprising:
  a plurality of interdigital transducers and accommodated in a plastic package,
  wherein said plastic package comprises a terminal member comprises metal extending out of the package and extending into the package such as to form an L-shaped portion, the chip substrate being accommodated in the plastic package such that the back surface of the chip substrate is in contact with the L-shaped portion,
  wherein a first pattern as an extension of part of the interdigital transducers, a second pattern spaced apart from the first pattern and a dummy electrode pattern connected to the second pattern are formed on the front surface of the chip substrate as an electric discharge preventing means for preventing electric discharge among the plurality of interdigital electric patterns.

19. An SAW filter device including an SAW filter according to claim 18, which comprises a plastic package including a terminal member comprising metal extending out of the package and extending into the package such as to form an L-shaped portion, the chip substrate being accommodated in the plastic package such that the back surface of the chip substrate is in contact with the L-shaped portion.

20. A package for accommodating a surface acoustic wave (SAW) filter formed on the front surface of a chip substrate, said package comprising:
  a plastic molding formed having a front surface, a back surface, an edge wall, and a central recess for receiving said SAW filter; and
  a plurality of terminals extending out of the package and extending into the package,
  wherein one of said terminals comprises an L-shaped portion and the back surface of said chip substrate contacts said L-shaped portion.

21. The package for accommodating an SAW tilter of claim 20, wherein said terminal comprising said b-shaped portion comprises a ground terminal.

22. The package for accommodating an SAW filter of claim 20,
  wherein said terminal comprising said L-shaped portion comprises a longitudinal portion extending out of said package and a lateral portion extending into said central recess, said central recess being rectangular,
  wherein said lateral portion extends into said recess to create a contact with said chip substrate.

23. A surface acoustic wave (SAW) filter device with a chip substrate of a piezoelectric material, comprising:
  a plurality of interdigital transducers and accommodated in a plastic package, said plastic package comprising a terminal member made of metal extending out of the package and extending into the package such as to form an L-shaped portion, the chip substrate being accommodated in the plastic such that the back surface of the chip substrate is in contact with the L-shaped portion,
  wherein common potential means for providing a common potential in the interdigital transducers, charge neutralizing means for neutralizing charge generated on the chip substrate due to polarization, or charge escape means for causing escape of charge generated on the chip substrate due to polarization, is provided as electric discharge preventing means for preventing electric discharge among the plurality of interdigital transducers on the chip substrate.

24. The SAW filter device according to claim 23, wherein the back surface of the chip substrate is secured by a conductive adhesive to the package.

25. A surface acoustic wave (SAW) device, comprising:
  a chip substrate having a front surface and a back surface and formed from a piezoelectric material;
  a plurality of interdigital transducers formed on the front surface of said chip substrate;
  a high resistivity thin film provided between the chip substrate and the interdigital transducers, wherein said high resistivity film prevents electric discharge among the plurality of interdigital transducers on the chip substrate;
  a plastic package receiving said SAW filter; and
  a plurality of terminal members connected to said plastic package,
  wherein one of said terminal members comprises a lateral extending portion recessed into said package which contacts the back surface of said chip substrate.

26. The SAW device according to claim 25, further comprising:
  a conductive material film covering the front surface of the chip substrate and the interdigital transducers.

27. The SAW device according to claim 25, wherein said one of said terminal members comprises a plate extending out of the package and into the package to form an L-shaped portion, the chip substrate being accommodated in the plastic package such that the back surface of the chip substrate is in contact with the L-shaped portion.

28. The SAW device according to claim 25, wherein said high resistivity thin film substantially covers the entire interdigital transducer.

29. The SAW device according to claim 28, further comprising:
  a terminal member extending out of the package and extending into the package, thereby forming an L-shaped portion, the chip substrate being accommodated in the plastic package such that the back surface of the chip substrate is in contact with the L-shaped portion.

30. The SAW device according to claim 25, further comprising:
  a conductive material film covering the front surface of the chip substrate and the interdigital transducers.

31. The SAW device according to claim 25, wherein said high resistivity film substantially covers the front surface of said chip substrate.

32. The SAW device according to claim 25, wherein said high resistivity film surrounds the front surface center portion of the chip substrate.

* * * * *